United States Patent [19]

Cowpland et al.

[11] 3,714,529

[45] Jan. 30, 1973

[54] THIN FILM CAPACITOR

[75] Inventors: Michael C. J. Cowpland; David J. Dickinson, both of Ottawa, Ontario, Canada

[73] Assignee: Microsystems International Limited, Montreal, Quebec, Calif.

[22] Filed: May 4, 1971

[21] Appl. No.: 140,162

[52] U.S. Cl. ............317/261, 29/25.42, 317/101 CC

[51] Int. Cl. ............H01g 1/14

[58] Field of Search ......338/195; 29/25.42; 317/261, 317/101 CC

[56] References Cited

UNITED STATES PATENTS

| | | | |
|---|---|---|---|
| 3,531,581 | 9/1970 | Chesemore | 317/101 CC |
| 2,993,266 | 7/1961 | Berry | 317/261 X |
| 3,573,703 | 4/1971 | Burks | 338/195 |

*Primary Examiner*—E. A. Goldberg
*Attorney*—L. Brook Keneford

[57] ABSTRACT

An improved mask-design for integrated circuit components having stepped layers of conductive material, — for example, thin-film capacitors. The mask is designed so that the step between the levels of the layer will be continuous and uniform, thereby ensuring electrical continuity across the layer.

4 Claims, 7 Drawing Figures

PATENTED JAN 30 1973 3,714,529

INVENTORS
MICHAEL C. J. COWPLAND
DAVID J. DICKINSON
BY L. Brooke Kenford
PATENT AGENT

THIN FILM CAPACITOR

This invention relates to an improved mask design for thin film devices, and in particular, such devices wherein continuity between stepped layers of electrically conducting material is required. The invention is particularly useful in the fabrication of thin film capacitors, and for convenience will be explained with reference to such a device. A thin film capacitor comprises a first conductive layer deposited on a substrate, a dielectric layer deposited over such substrate, and a second conductive layer deposited over the dielectric layer. Typically, the lower conductive layer is tantalum, the dielectric layer tantalum oxide, and the top layer gold. When depositing the gold layer, the mask is designed to permit a gold contact electrode to be formed continuous with the top plate. However, it has been found that one of the main reasons for failure of thin film capacitors fabricated in this manner is that the gold top layer of the capacitor and the deposited contact are not continuous. This is because during deposition, the dielectric layer tends to form an overhang around the edges of the device. Also, there is a channel in the substrate around the perimeter of the dielectric layer caused by overetch of the substrate. This channel must be bridged by the gold contact layer in order to ensure continuity with the gold top conductive layer. It is here that the overhang of the dielectric layer becomes a problem because the overhang tends to shadow the channel from deposition of the gold contact layer in the channel particularly if the direction of deposition is from behind or to one side of the overhang and there is therefore a tendency for thin or even completely discontinuous areas to be formed in the overhang area. If these areas are sufficiently extensive, this leads to inherent or actual defect in the device due to open-circuit between the top conductive layer and the contact layer.

The purpose of the present invention is to obviate the aforementioned problem by providing a mask pattern at the region of the dielectric overhang and the contact area which will ensure that continuity exists between the deposited contact layer and the top conductive layer.

The problem of discontinuity between the two layers of material in the thin film capacitor described above is present to a greater or lesser extent in any device wherein continuity between stepped layers of electrically conducting material is required. This is particularly so, if the step is caused by the previous formation of one or more layers of material over which the electrically conductive stepped layer is to be applied, such previous layers having been formed by deposition and etching techniques, since the overetch channel in the substrate around the step is almost inevitable.

Thus, the invention broadly comprises a method and apparatus for the fabrication of any thin film device having a stepped layer of deposited material, between the upper and lower levels of which continuity is required.

In accordance with the invention, by use of a suitable mask design the edge of a previously formed layer is exposed to deposition of the stepped layer material in a number of directions so that it is virtually impossible for a continuous gap to exist at the step between the upper and lower levels of the stepped layer material, no matter what direction the deposition material tends to take. In other words, by facing the edge of the previously formed layer in a number of orientations, at least a substantial portion of the step region coating will be continuous and the chances of open-circuit between the upper and lower levels of the stepped layer are therefore greatly decreased.

The invention will now be described further by way of example only and with reference to the accompanying drawings wherein, FIG. 1 is a partially cut away perspective view of the thin film capacitor according to the invention;

Figure 1:
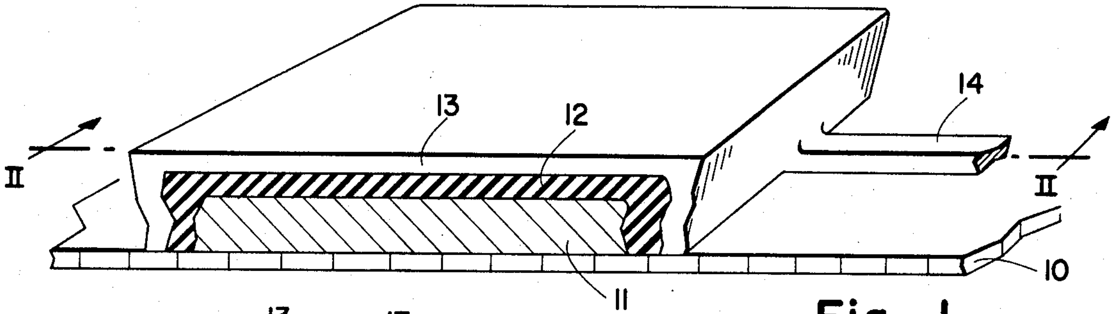
Fig. 1 PRIOR ART

Referring now to FIG. 1, a thin film capacitor typically comprises a glass substrate 10, a lower conductive layer 11, a dielectric layer 12 deposited upon said layer 11, and an upper conductive layer 13 deposited upon the layer 12. In this particular example, lower conductive layer 11 is tantalum, dielectric layer 12 is tantalum oxide, and the upper conductive layer 13 is gold. It may be seen that when the top layer 13 is deposited, the deposition mask is designed to permit deposition of the layer 13 to extend to a contact layer 14.

Figure 2:
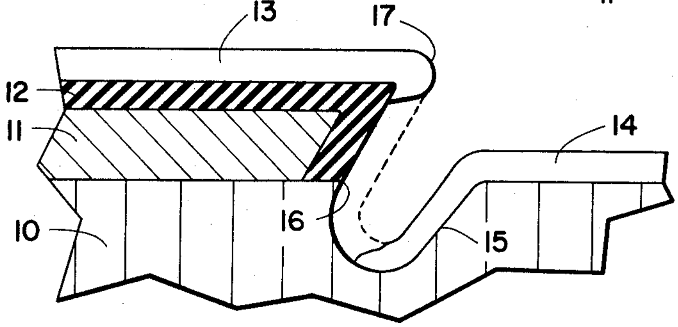
Fig. 2 PRIOR ART
FIG. 2 is a section on the line II—II of FIG. 1.

Turning now to FIG. 2, it may be seen how the slight overhang (much exaggerated in the drawing) formed by the deposition of the dielectric layer 12 tends to shadow the channel 15 formed by the normal overetch of the substrate 10. The dotted line defines the path which the gold layer 13 should take in order to be continuous with the contact region 14. In fact, as shown in the drawing, a gap between regions 13 and 14 can exist due to shadowing by the overhang. If this gap extends across the whole width of contact 14, then open-circuit will clearly result.

Figure 3:
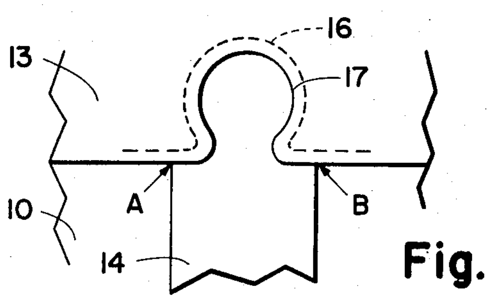
FIGS. 3, 4, 5 and 6 are top views of assemblies fabricated in accordance with the invention.

In FIG. 3, it will be seen that in one embodiment of the invention the periphery of the overhang 17 (see FIG. 2) is shaped in upper-case Omega-fashion. The dotted line 16 shows the perimeter of the base of the device (see also FIG. 2). Taking the edges A and B of the contact 14 as reference points, it may be seen that the extent of the perimeter 17 between these points covers almost a full 360°. Thus, no matter what direction the deposit material tends to take during deposition of the top and contact layers, it is almost certain that the overhang will not be shadowed from the deposition material over its full extent and will be properly coated at least over a substantial portion thereof, and electrical continuity between the layer 13 and the contact 14 ensured.

Figure 4:
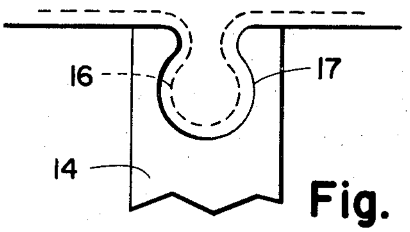
Figure 5:
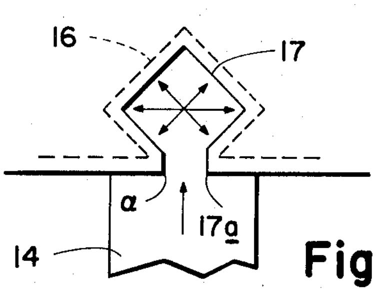
Figure 6:
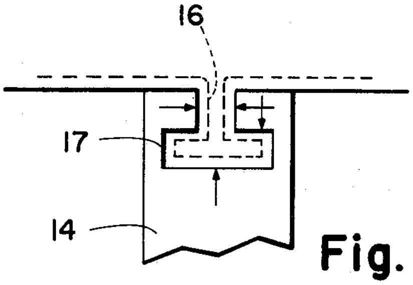

FIGS. 4, 5 and 6 show alternative configuration for the perimeter profile 17. In FIG. 4, an Omega-shape is again used, but this time extending into the contact region 14 rather than into the device. In FIG. 5, a diamond-shape arrangement is shown extending into the device and in FIG. 6 the perimeter 17 is T-shaped, extending into the contact 14. FIG. 5 gives seven directions of exposure as shown by the arrows, containing six 45° angles and one 90° angle. FIG. 6 contains four directions of exposure mutually at right angles. From the point of view of efficiency, therefore, FIGS. 3 and 4 would tend to give the probability of maximum coating of the overhang due to their complete 360° exposure spectrum. Thus, it is apparent that due to the various directional components of the coating material during deposition thereof the probability of maximum coating of the overhang increases with the number of directions of exposure thereof. On this basis, the arrangement of FIG. 4 would be more efficient than that of FIG. 5, which in turn would be better than that of FIG. 6.

Figure 7:
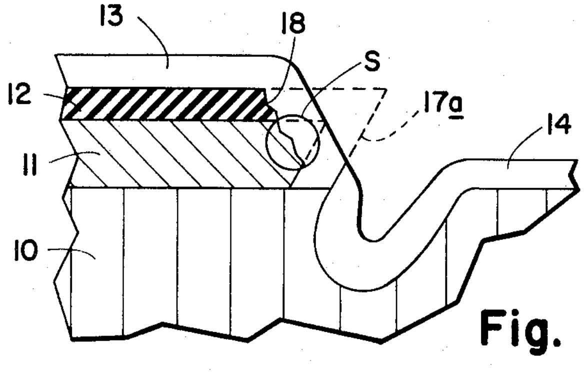
FIG. 7 is a cross section through the angle $\alpha$ of FIG. 5.

Turning once again to FIGS. 5 and 6, the arrangements shown therein have a certain disadvantage from a handling standpoint when compared to the arrangements of FIG. 3 and 4. It may be seen that the shapes of the perimeter 17 in FIGS. 5 and 6 contain sharp angles. In FIG. 7, the dotted lines show the outlines of the layer 11 and 12 at one of the sharp angles (for example angle $\alpha$ of FIG. 5) prior to deposition of the layer 13. However, during handling of the chip between the deposition of layers 12 and 13, the sharp edge 17*a* can be accidentally knocked off resulting in the kind of profile shown at 18. Now, the lower electrode layer is exposed and coating of the layer 13 will result in a short-circuit at the circled region S between the layers 11 and 13. Thus, it is preferable to avoid sharp angles in the perimeter pattern 17, but it is to be understood that this is a purely practical consideration which in no way affects the effectiveness of the designs shown in FIG. 5 and 6 insofar as the present invention is concerned. Clearly, if sufficient precautions are taken in handling the chip between the steps of depositing the layers 12 and 13, likelihood of damage to the perimeter angles 17*a* is remote.

It has been found that fabrication of thin film capacitors by the method of the present invention improves yield by up to 20 percent over conventional methods and greatly increases the reliability of the devices.

It will be realized by those skilled in the art that the patterns set forth above are to be considered in no way limiting upon the scope of the invention. It will further be realized that the invention has been described with reference to a capacitor for convenience only. Any thin film device wherein a conductive layer is to be deposited over a previously deposited layer and is to be deposited continuous with a lower layer may be fabricated in accordance with the present invention.

What is claimed is:

1. A thin-film capacitor having in combination, first and second conductive layers spaced by a dielectric layer, said first conductive layer being located upon a substrate, a contact layer upon said substrate, said first conductive layer having an edge portion adjacent said contact layer shaped in such manner as to face in a plurality of directions in a plane parallel to said substrate, said dielectric layer having an edge portion conforming to the shape of and covering said edge portion of said first conductive layer, said second conductive layer having an edge portion conforming to the shape of and covering said edge portion of said dielectric layer and electrically insulated from said edge portion of said first conductive layer by said edge portion of said dielectric layer, said edge portion of said second conductive layer being in electrical contact with said contact layer.

2. A thin-film capacitor as claimed in claim 1 wherein said contact and second conductive layers are simultaneously formed, said contact layer being homogeneous and continuous with said edge portion of said second conductive layer.

3. A thin-film capacitor as claimed in claim 1 wherein said step is generally upper-case Omega-shaped.

4. A thin-film capacitor as claimed in claim 2 wherein said step is generally upper-case Omega-shaped.

* * * * *